United States Patent
Tien et al.

(10) Patent No.: US 11,204,897 B2
(45) Date of Patent: Dec. 21, 2021

(54) IMPORTING AND EXPORTING CIRCUIT LAYOUTS

(71) Applicant: TAIWAN SEMICONDUCTOR MANUFACTURING CO., LTD., Hsinchu (TW)

(72) Inventors: Fu An Tien, Hsinchu (TW); Changsheng Ying, San Jose, CA (US); Hsu-Ting Huang, Hsinchu (TW); Ru-Gun Liu, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 230 days.

(21) Appl. No.: 16/669,320

(22) Filed: Oct. 30, 2019

(65) Prior Publication Data
US 2020/0133924 A1 Apr. 30, 2020

Related U.S. Application Data

(60) Provisional application No. 62/753,906, filed on Oct. 31, 2018.

(51) Int. Cl.
*G06F 16/174* (2019.01)
*G06F 16/16* (2019.01)
*G06F 30/392* (2020.01)
*G06F 30/34* (2020.01)
(Continued)

(52) U.S. Cl.
CPC ........ *G06F 16/1744* (2019.01); *G06F 16/164* (2019.01); *G06F 30/34* (2020.01); *G06F 30/36* (2020.01); *G06F 30/39* (2020.01); *G06F 30/392* (2020.01)

(58) Field of Classification Search
None
See application file for complete search history.

(56) References Cited

U.S. PATENT DOCUMENTS 9,256,142 B2   2/2016  Lee-Chih et al.
9,530,200 B2  12/2016  Hsueh et al.
10,025,175 B2  7/2018  Tsai et al.
(Continued)

*Primary Examiner* — Irene Baker
(74) *Attorney, Agent, or Firm* — McDermott Will & Emery LLP

(57) ABSTRACT

A computer-implemented method includes executing, using a computer, a process including a main thread that receives a layout file. The layout file includes a first plurality of tags and compressed information blocks. Each tag of the first plurality is associated with a compressed information block. The method further includes decompressing the compressed information blocks using sub-threads and thereby obtaining decompressed information blocks. The sub-threads are created by the main thread, and each sub-thread corresponds to a compressed information block. The decompressed information blocks are combined into decompressed layout information. The decompressed file is partitioned and each partition is provided to a node of a distributed computing system for performing layout correction. Multiple result files each in a compressed format are obtained from the distributed computing system and the result files are combined to obtain a single result file without decompressing and re-compressing the results from the distributed computing system.

20 Claims, 11 Drawing Sheets

(51) Int. Cl.
    *G06F 30/36*          (2020.01)
    *G06F 30/39*          (2020.01)

(56) References Cited

U.S. PATENT DOCUMENTS

| | | | | |
|---|---|---|---|---|
| 2008/0235497 | A1* | 9/2008 | Tomblin | G06F 30/39 |
| | | | | 712/225 |
| 2013/0339323 | A1* | 12/2013 | Sulieman | G06F 16/182 |
| | | | | 707/693 |
| 2016/0344849 | A1* | 11/2016 | Thomas | G16B 30/00 |
| 2019/0146328 | A1 | 5/2019 | Huang et al. | |
| 2019/0164852 | A1 | 5/2019 | Peng et al. | |

* cited by examiner

IMPORTING AND EXPORTING CIRCUIT LAYOUTS

CROSS REFERENCE TO RELATED APPLICATION

This application claims priority of U.S. Provisional Patent Application No. 62/753,906 filed on Oct. 31, 2018, the entire contents of which are incorporated herein by reference.

BACKGROUND

Technological advances in integrated circuit (IC) industry have produced generations of ICs having smaller sizes and more complex circuits than the previous generation. An IC design process is used for designing various patterns that form complex circuits.

In the IC design process, a circuit designer uses a computer program to develop a logical description of the various components that form a circuit. The logical description is then converted into a description of the individual circuit building blocks performing the desired circuit functions. The description of the individual circuit building blocks is further converted into a layout file that specifies a predetermined pattern of a reticle for exposing a wafer during a photolithographic process in order to form various layers of the IC.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

A method for manufacturing an integrated circuit (IC) includes generating a layout of the circuit using one or more computer implemented electronic design automation (EDA) software/tool. The layout includes one or more layers of circuit patterns designed for the integrated circuit (IC), based on the specification of the integrated circuit (IC). The layout is presented in one or more data files (layout files) having information of the geometrical patterns (shapes). The layout file has a data format such as, but not limited to, a graphic data system (GDS or GDSII) and an open artwork system interchange standard (OASIS) proposed by Semiconductor Equipment and Materials International (SEMI). The layout is designed by a designer based on the specification of the product to be manufactured. In one example, the designer is a design house. In another example, the designer is a design team separated from a semiconductor manufacturer (fab) that makes IC products according to the IC design layout. In various embodiments, the semiconductor manufacturers make photomasks, IC products, or both.

Figure 1:
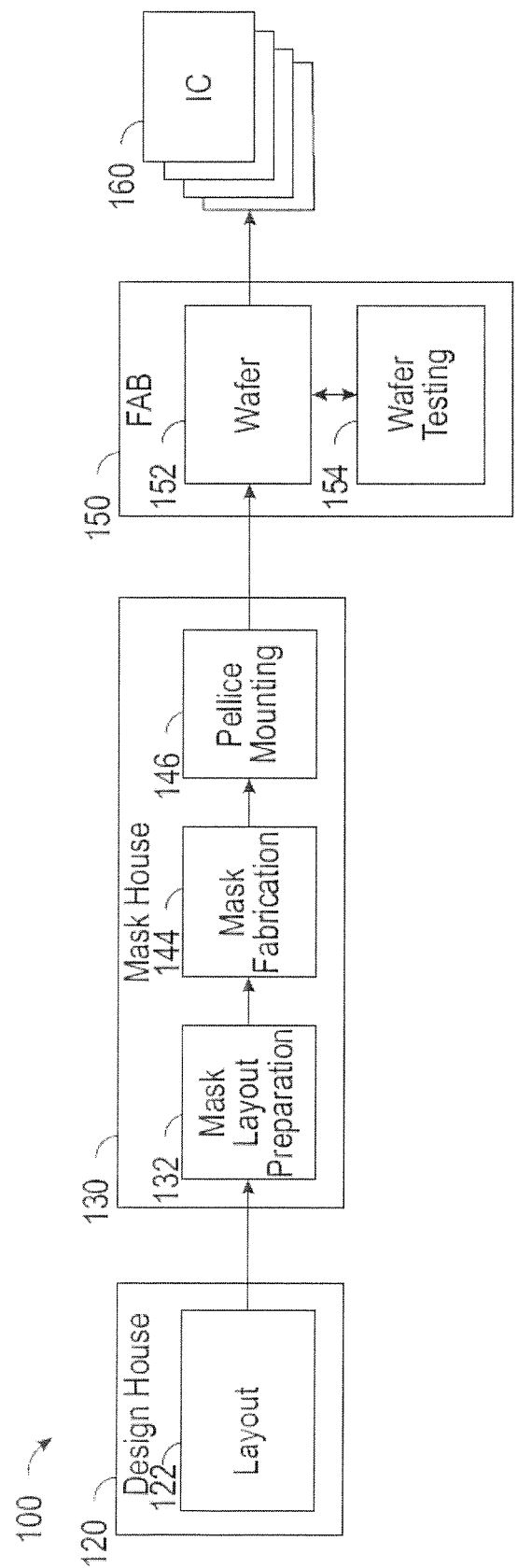
FIG. 1 is a schematic block diagram of an embodiment of an integrated circuit (IC) manufacturing system and an IC manufacturing flow associated with the IC manufacturing system.

FIG. 1 is a schematic block diagram of an embodiment of an integrated circuit (IC) manufacturing system 100 and an IC manufacturing flow associated with the IC manufacturing system. The IC manufacturing system 100 includes a plurality of entities, such as a design house 120, a mask house 130, and an IC manufacturer 150 (i.e., a fab), that interact with one another in the design, development, and manufacturing cycles and/or services related to manufacturing an integrated circuit (IC) device 160. The plurality of entities are connected by a communications network, which may be a single network or a variety of different networks, such as an intranet and the Internet, and may include wired and/or wireless communication channels. Each entity may interact with other entities and may provide services to and/or receive services from the other entities.

The design house (or design team) 120 generates the layout (IC design) 122 that includes various geometrical patterns designed for an IC product, based on a specification of the IC product to be manufactured. The geometrical patterns correspond to patterns of metal, oxide, or semiconductor layers that make up the various components of the IC device 160 to be fabricated. The various layers combine to form various IC features. For example, a portion of the layout 122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 120 implements a proper design procedure to form the layout 122. The design procedure may include logic design, physical design, and/or place and route. As mentioned above, the layout 122 is presented in one or more data files (GDSII, OASIS, etc.) having information of the geometrical patterns.

The mask house 130 uses the layout 122 to manufacture one or more masks to be used for fabricating the various layers of the IC product according to the layout 122. The mask house 130 performs mask layout preparation 132, where the layout 122 is translated into a form that can be physically written by a mask writer. Commonly, an IC design may be replicated multiple times on a mask such that when radiation is passed through the mask during photolithography multiple copies of the IC design (or dies) may be formed within a single exposure field (or region) of a semiconductor wafer. As an aspect of this, during mask layout preparation 132, the layout of the mask design may be determined including the location and number of dies to be formed within an exposure field, the location and width of scribe line regions (scribe lanes) around the dies, and the location and type of test structures to be formed on the wafer.

Additionally, mask layout preparation 132 may include optical proximity correction (OPC) and a lithography process check (LPC) on the layout 122 to compensate for image errors and simulate mask fabrication. The mask house 130 also performs mask fabrication 144, where the design layout prepared by the mask layout preparation 132 is modified to comply with a particular mask writer and/or mask manufacturer and is then fabricated. The mask layout preparation 132 and mask fabrication 144 are illustrated as separate elements, however, the mask layout preparation 132 and mask fabrication 144 can be collectively referred to as mask data preparation.

During mask fabrication 144, a mask or group of masks are fabricated based on the mask design layout which incorporates one or more copies of the layout 122 as modified by mask layout preparation 132. For example, an electron-beam (e-beam) or a mechanism of multiple e-beams is used to form a pattern on a mask (photomask or reticle) based on the mask design layout. The mask can be formed using various technologies, e.g., binary technology or a phase shift technology.

After a mask has been fabricated, the mask house performs a mask inspection to determine if the fabricated mask includes any defects, such as full-height and non-full-height defects. If any defects are detected, the mask may be cleaned or the mask design layout and/or IC design may be modified further depending on the types of defects detected.

If a mask passes inspection, the mask undergoes a pellicle mounting process 146 during which a pellicle is secured to the mask to prevent particles from falling onto the mask pattern and causing defects during subsequent lithography processes. In some embodiments, a pellicle includes a thin film stretched across a frame that is secured to the mask by an adhesive or other semi-permanent or permanent fastener. The frame holds the film a distance above the mask pattern such that particles deposited on the film will be out of focus during illumination of the mask.

It should be understood that the above description of the mask layout preparation 1132 has been simplified for the purposes of clarity, and layout preparation may include additional features such as a logic operation (LOP) to modify the IC design layout according to manufacturing rules, a retarget process (RET) to modify the IC design layout to compensate for limitations in lithographic processes used by IC manufacturer 150, and a mask rule check (MRC) to modify the IC design layout to compensate for limitations during mask fabrication 144. Additionally, the processes applied to the layout 122 during mask fabrication 144 and mask inspection may be executed in a variety of different orders and may include a variety of different and/or additional steps.

The IC manufacturer 150, such as a semiconductor foundry, uses the mask (or masks) fabricated by the mask house 130 to fabricate a semiconductor wafer 152 having a plurality of the IC devices 160 thereon. The IC manufacturer 150 is an IC fabrication business that can include a myriad of manufacturing facilities for the fabrication of a variety of different IC products. The semiconductor wafer 152 is fabricated using the mask (or masks) to form a plurality of the IC devices 160. The semiconductor wafer includes a silicon substrate or other suitable substrate having material layers formed thereon. The semiconductor wafer may further include various doped regions, dielectric features, and multilevel interconnects (formed at subsequent manufacturing steps). The mask may be used in a variety of processes. For example, the mask may be used in an ion implantation process to form various doped regions in the semiconductor wafer, in an etching process to form various etching regions in the semiconductor wafer, in a deposition process (e.g., chemical vapor deposition (CVD) or physical vapor deposition (PVD)) to form a thin film in various regions on the semiconductor wafer, and/or other suitable processes. Further, during a photolithography process, light is passed though the mask (and pellicle) so as to transfer the pattern on the mask to the semiconductor wafer.

After a semiconductor wafer 152 has been fabricated it may be subjected to wafer testing 154 to ensure the integrated circuits formed thereon conform to physical manufacturing specifications and electrical performance specifications. After the wafer 152 passes wafer testing 154, it may be diced (or sliced) along scribe lines to separate the IC devices 160 formed thereon. The dicing process can be accomplished by scribing and breaking, by mechanical sawing (e.g., with a dicing saw) or by laser cutting. Following the dicing process, the plurality of IC devices 160 are individually packaged for use in building electronic devices and, in some embodiments, may be subjected to further individual testing.

As the complexity of the circuit design increases, the size of the layout file including the layout 122 also increases (e.g., greater than 1 TB). The layout file is in a compressed form (e.g., reduced file size) and provided to the mask house 130 for manufacturing one or more masks. At the mask house 130, a host (or local) computing system (e.g., a host computing system 1010 illustrated in FIG. 10) of the mask house 130 communicably coupled to the mask house 130 decompresses the compressed file (e.g., restored to the original file size), and stores the decompressed layout file in a library (or database) accessible by the mask house 130. Because of the large file size, decompressing the layout file is a time consuming and resource intensive process.

As mentioned, the mask layout preparation 132 includes layout correction techniques such as optical proximity correction (OPC), a lithography process check (LPC), and mask proximity correction (MPC) that are performed on the layout 122 to compensate for image errors and simulate mask fabrication. The layout correction operations are performed in a distributed computing system (e.g., cluster computing, server farms, cloud computing). For example, the algorithm for performing the layout correction is executed on multiple computing nodes of the distributed computing system. Stated otherwise, each computing node executes an instance of the layout correction algorithm. The host computer partitions the layout file stored in the library and distributes the partitions to the multiple computing nodes of the distributed computing system. Each computing node performs the layout corrections on the portion of the layout file provided thereto using the instance of the layout correction algorithm executing on the computing node.

The results of the layout correction operations including corrected layout information are stored on the respective computing nodes as compressed files. Once each computing node has completed layout correction on the portion of the layout file, the host computer sequentially (one node at a time and in an order) obtains the compressed files from each computing node. After a compressed file is obtained from a computing node, the file is decompressed into a database (for example, a database accessible by the host computer) and the data from the database is stored in an output buffer. The host computer obtains the corrected layout information from all computing nodes and stores the data in the output buffer. The data in the buffer is then compressed to a single corrected layout file that includes the corrected layout information for the layout 122 defined in the layout file.

Thus, the process includes decompressing files from each computing node into a database (for example, a database of the host computer), retrieving data from the database, attaching data into the buffer of a single corrected file and compressing the single corrected layout file. The single corrected layout file is even larger in size (around 30 TB) than the original layout file. This sequential operation of obtaining the single corrected layout file is a resource intensive and time consuming process. The larger the size of the files to be added, the longer is the processing time.

Embodiments disclosed herein are directed to reducing the time required for importing a layout file into the mask house and the time required for merging the files from multiple computing nodes to obtain a single corrected layout file. According to some embodiments, the compressed file is constructed from multiple corrected clip files (e.g., portions of the layout file). According to some embodiments, processed compressed files obtained from the computing nodes are appended to each other to directly obtain the final result file. Advantageously, the redundant steps of decompressing and compressing the files prior to merging are eliminated. Thus, embodiments disclosed herein substantially reduce processing times when importing the layout file and when merging files to obtain the corrected layout file. As a result, the final corrected file is available with minimal delay for providing to the computing nodes. By appending the processed layout files obtained from the computing nodes without decompressing and compressing the files, the steps of obtaining the processed layout files and creating the result file are performed in parallel (e.g., with minimal delay) and time required for merging the files is substantially reduced.

Figure 2A:
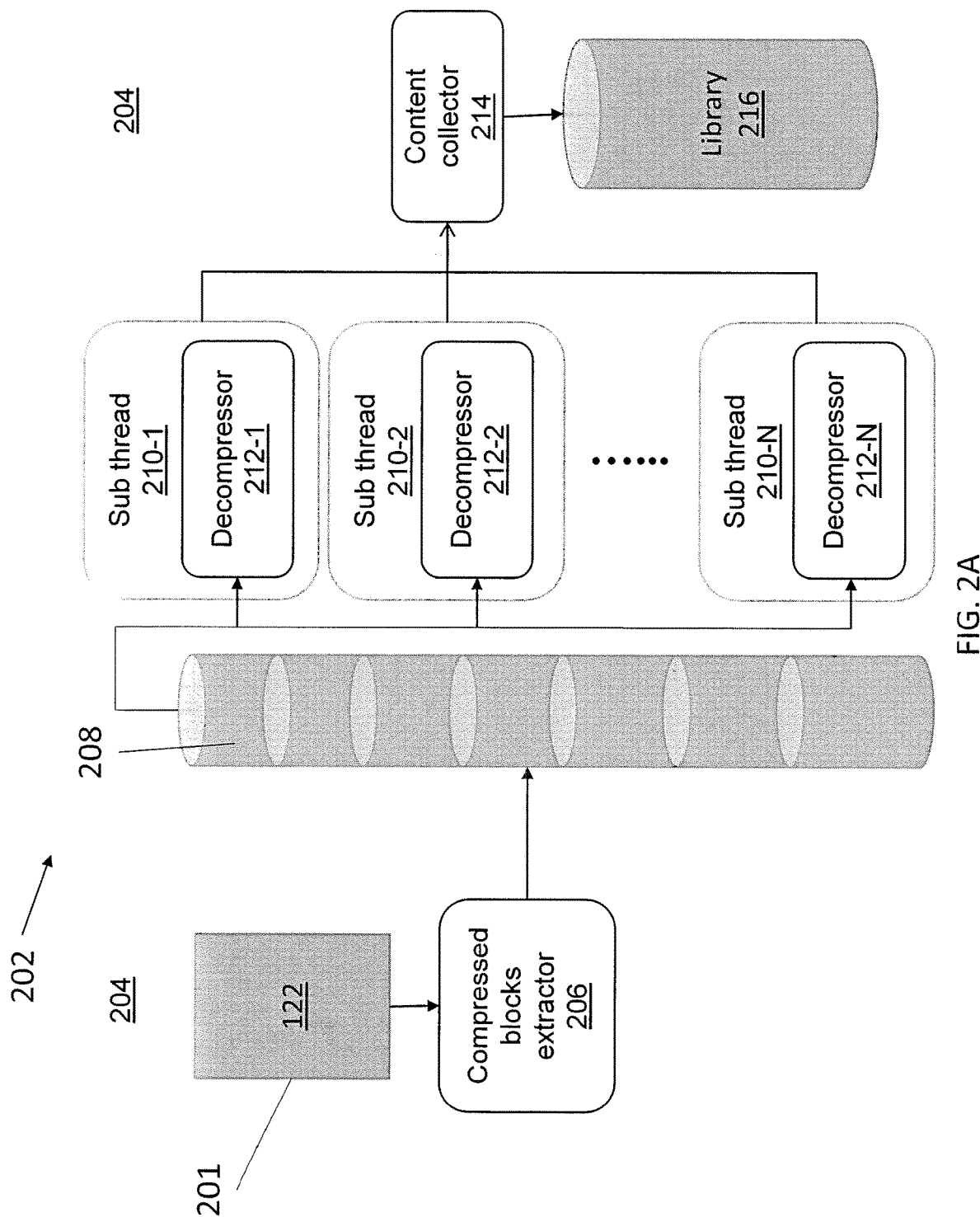
FIG. 2A illustrates the process flow during an import operation for importing the layout file into the mask house, according to embodiments.
Figure 10:
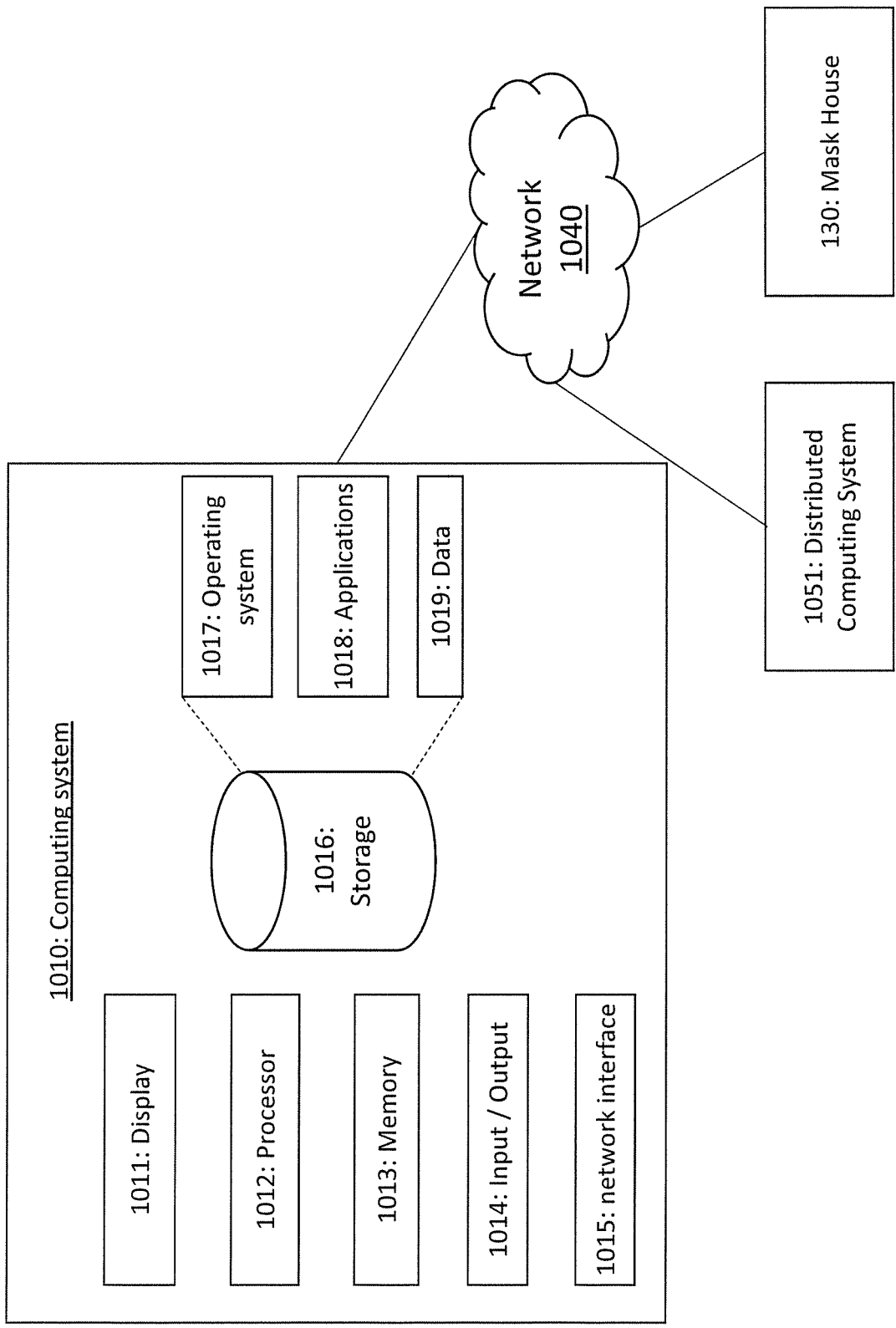
FIG. 10 illustrates a host computing system for implementing the method in accordance with some embodiments of the disclosure.

FIG. 2A illustrates a process 202 during an import operation for importing the layout file into the mask house 130, according to some embodiments. In some embodiments, the process 202 is performed using the host computing system 1010 (FIG. 10), which receives a layout file 201 (FIG. 3) including the layout 122 from the design house 120 and executes one or more of the process 202 (one shown) for receiving the layout file 201 and for decompressing the layout file 201. The algorithm (logic) for executing the various operations in the process 202 are implemented in hardware (logic gates) in the host computing system 1010 (FIG. 10). In other embodiments, the algorithm (logic) is implemented in software. In still other embodiments, the algorithm (logic) is implemented as a combination of software and hardware. For the purposes of discussion herein, the layout file is considered to be an OASIS file. However, embodiments are not limited in this regard, and are equally applicable to layout files of different formats, without departing from the scope of the disclosure.

Figure 3:
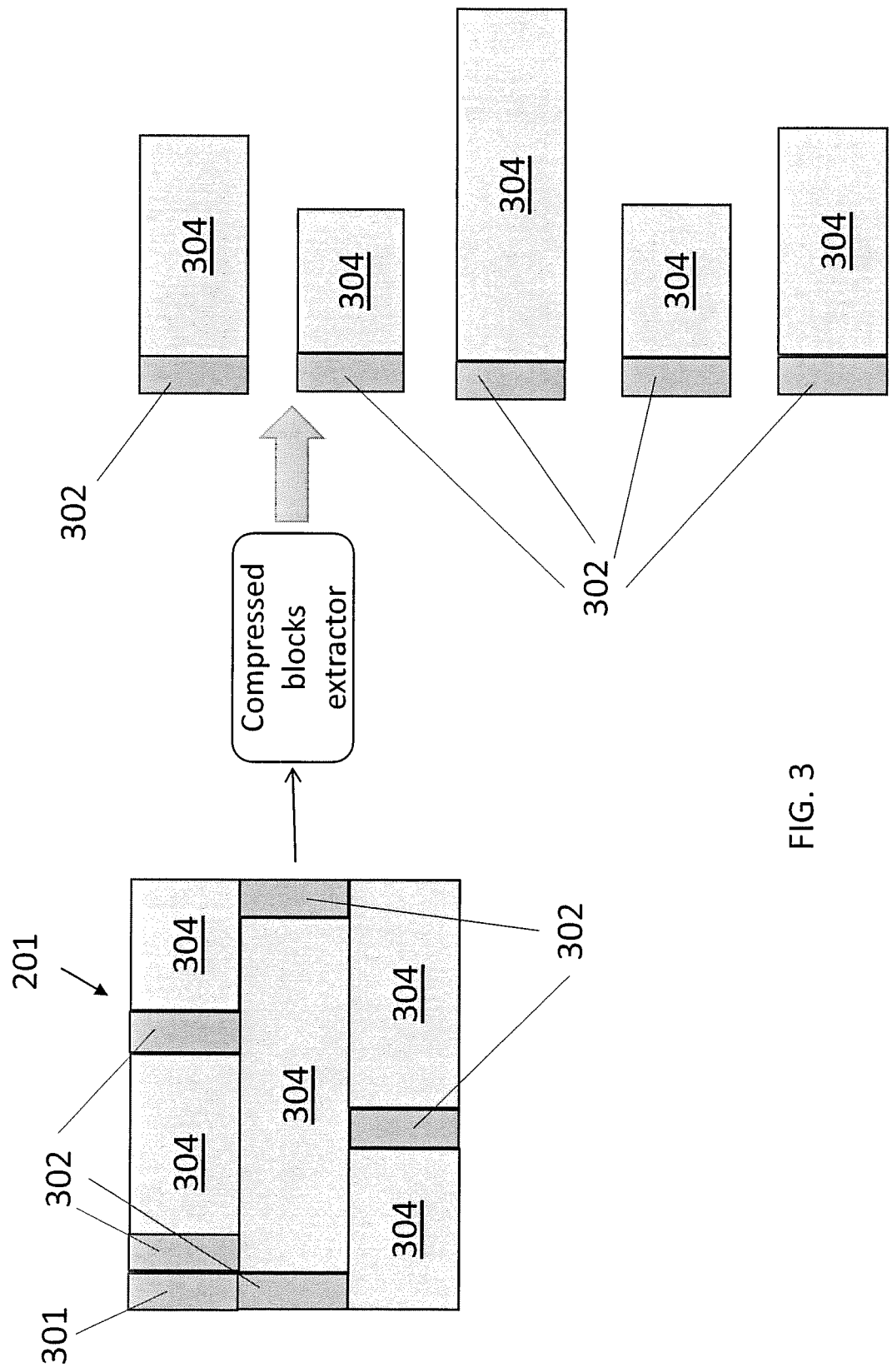
FIG. 3 illustrates a schematic representation of the syntax (structure) of the layout file of FIG. 2A.

Referring briefly to FIG. 3, illustrated therein is a schematic representation of the syntax (structure) of the layout file 201. As illustrated, the layout file 201 includes a header 301 that identifies a start of the file. Following the header 301, are a tag 302 and an information block 304 (in compressed form) associated with the tag 302 information. The information block 304 includes layout information (e.g., shape information) required to manufacture the mask for fabricating the IC circuit. Layout 122, as mentioned above, generally refers to the layout information in the information block 304.

The layout file 201 includes multiple tags 302, each followed by corresponding information blocks 304. Each information block 304 can be of a different size (bit size) or each information block 304 can have the same size. Referring to the syntax of an OASIS file, the header 301 may be or include the magic-bytes, the START record, and a table of offset values. The offset values indicate locations of tags in the file. For example, an offset value of 100 indicates that the tag is located 100 bytes from the beginning of the layout file. As discussed below, based on the offset values, the tags 302 and information blocks 304 included in the layout file 201 are obtained. The information block 304 includes one or more records including PAD, PROPERTY, CELL, XYRELATIVE, XYABSOLUTE, RECTANGLE, POLYGON, PATH, TRAPEZOID, CTRAPEZOID, CIRCLE, XGEOMETRY, PLACEMENT, TEXT, XELEMENT, CELLNAME, TEXTSTRING, LAYERNAME, PROPNAME, PROPSTRING, XNAME. More information on the syntax of an OASIS file can be obtained from Semiconductor Equipment and Materials International (SEMI).

Referring back to FIG. 2A, with continued reference to FIG. 3, the process 202 includes a main (or primary) thread 204 which receives the layout file 201 and provides the layout file 201 to a compressed block extractor 206 of the main thread 204. The compressed block extractor 206 analyzes the received layout file 201 to identify the header 301 of the layout file 201. The compressed block extractor 206 checks the layout file 201 for the offset table and the offset values are stored in a data buffer 208. In some embodiments, the data buffer 208 is implemented as first-in-first-out (FIFO) data structure (e.g., a queue).

Simultaneously, or near simultaneously, while performing the above operations in the main thread 204, the process 202 creates sub-threads 210 (individually sub-threads 210-1, 210-2, . . . , 210-N). Using the offset values, each sub-thread 210 seeks the layout file 201 to obtain tags and corresponding compressed information blocks 304 from the data buffer 208, and performs a decompression operation on the received compressed information block 304 using the included decompressor 212. Each decompressor 212 outputs a decompressed information block that includes decompressed layout information. The decompressed layout information from each sub-thread 210 is provided to a content collector 214. The content collector 214 receives the decompressed layout information from the sub-threads 210 and combines the decompressed layout information. The combined decompressed layout information is stored in a library (or database) 216. It will be understood that decompressed information block, as used herein, refers to an information block that previously included layout information in a compressed form and that was decompressed to obtain the layout information.

For the sake of explanation, the discussion above assumes that all information blocks 304 in layout file 201 include layout information in compressed form (compressed information blocks). However, embodiments are not limited in this regard. In some embodiments, the layout file 201 also includes blocks that include layout information in uncompressed form (referred to uncompressed information blocks), which is indicated by the associated tags. In such embodiments, when uncompressed information blocks are identified by the compressed blocks extractor 206 based on the associated tags, the uncompressed information blocks are retained in the main thread 204 and provided to the content collector 214 for the uncompressed information blocks in the decompressed layout information. For the purposes of discussion herein, it should be noted that the uncompressed layout information refers to layout information that is originally included in uncompressed form in the layout file received from the design house.

When exporting the layout file, the host computing system 1010 (FIG. 10) partitions the combined decompressed layout information stored in the library (or database) and distributes the partitions to the computing nodes of the distributed computing system. Each computing node performs the layout corrections (e.g., optical proximity correction (OPC), a lithography process check (LPC), or mask proximity correction (MPC)) on the partition (or portion) of the combined decompressed layout information provided thereto using the instance of a layout correction algorithm executing on the computing node. The partition could be a range or a file that is provided to a computing node for performing the layout correction.

Figure 2B:
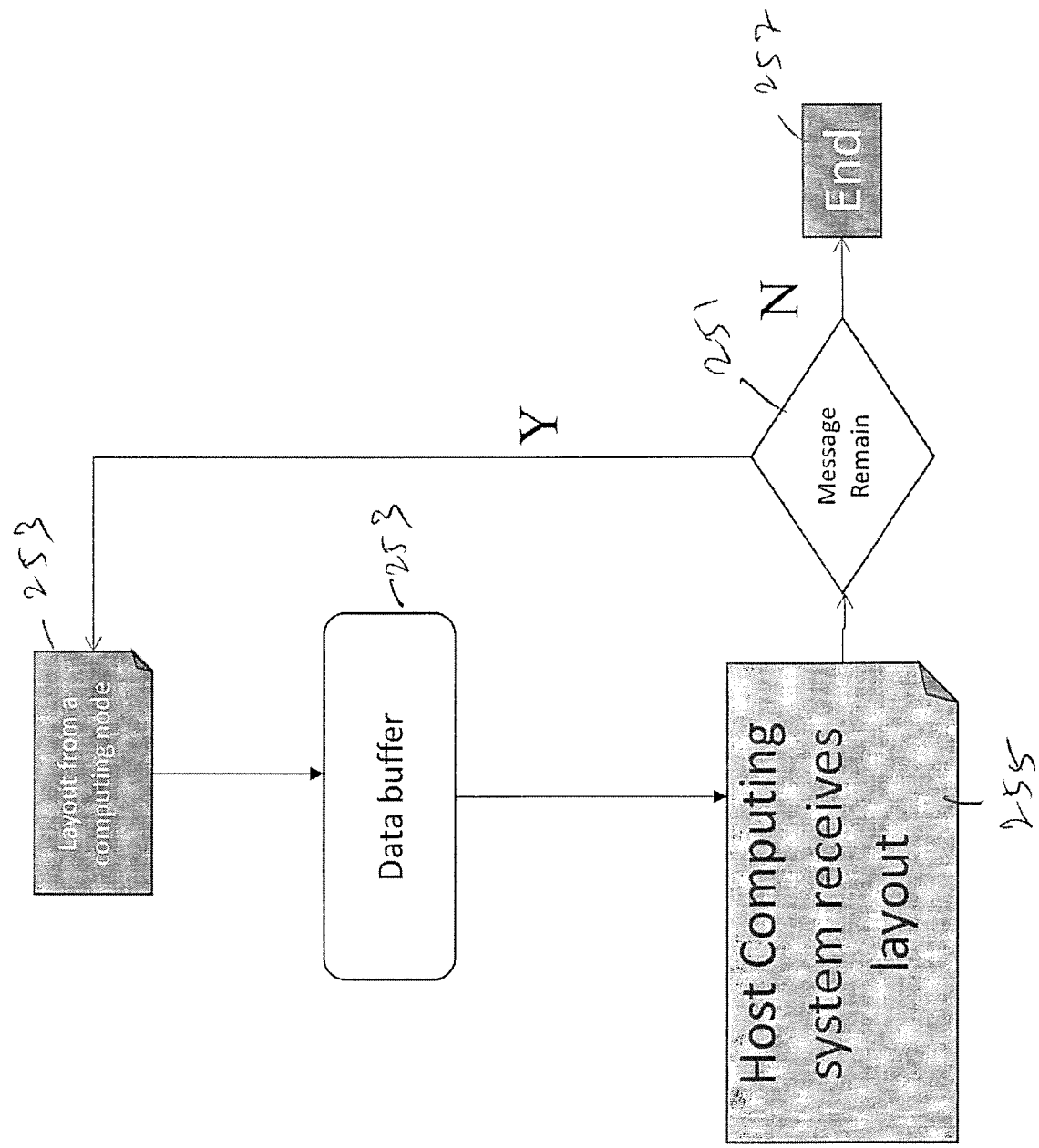
FIG. 2B illustrates a flowchart of the process flow for obtaining the correct layout generated by each computing node, according to embodiments.

Once a computing node has completed the layout correction operation on the portion provided thereto, the computing node indicates completion of operation to the host computing system 1010 (FIG. 10). In some embodiments, the computing node will indicate completion of operation by sending the host computing system 1010 (FIG. 10) a message that includes the location of the corrected file stored in a data buffer (queue). The host computing system 1010 (FIG. 10) reads the message from the data buffer and obtains the corrected layout file, which is stored in a compressed form. The host computing system 1010 (FIG. 10) checks the data buffer at desired intervals for messages from the computing nodes until messages have been received from all computing nodes. FIG. 2B illustrates a flowchart of the process flow 250 for obtaining the correct layout generated by each computing node. The host computing system checks for new messages at 251 from a computing node 253. If new messages are present, the host computing system reads the messages from the data buffer at 255. After messages have been received from all computing nodes, the process ends at 257.

The host computing system 1010 (FIG. 10) obtains the corrected layout information in the corrected file(s). The corrected layout information is stored in a memory of the host computing system 1010 (FIG. 10) and appended to a corrected layout information obtained from a different computing node. The result is a single corrected layout file corresponding to the layout file 201 and in a compressed format.

The process above is repeated until messages from all computing nodes have been read. In the end, a compressed result file including the corrected layout information is obtained.

It will thus be understood that the process does not include the steps of decompressing and recompressing the files obtained from the computing nodes. As a result, by using the method according to embodiments disclosed herein, time required to obtain the result file is reduced. It will be understood that not all advantages have been necessarily discussed herein, no particular advantage is required for all embodiments or examples, and other embodiments or examples may offer different advantages.

Figure 4:
FIG. 4 is a graph illustrating the variation in the time taken to import a layout file with increase in the number of threads.

FIG. 4 is a graph 400 illustrating the variation in the time taken to import a layout file with an increase in the number of threads. In FIG. 4, the number of threads is plotted on the abscissa and the time is plotted on the ordinate. As illustrated, by increasing the number of threads (sub-threads) for importing the layout file, time taken to import the layout file is decreased. As indicated by graph 400, importing the layout file in a single thread requires around 1400 seconds, while importing the same layout file in threads requires about 200 seconds, thereby achieving about 85% improvement in time required. As an example, a 1 TB layout file takes around 7 hours to import without using the method discussed above, while the same file takes around 4 hours when imported using the method according to embodiments discussed above.

Figure 5:
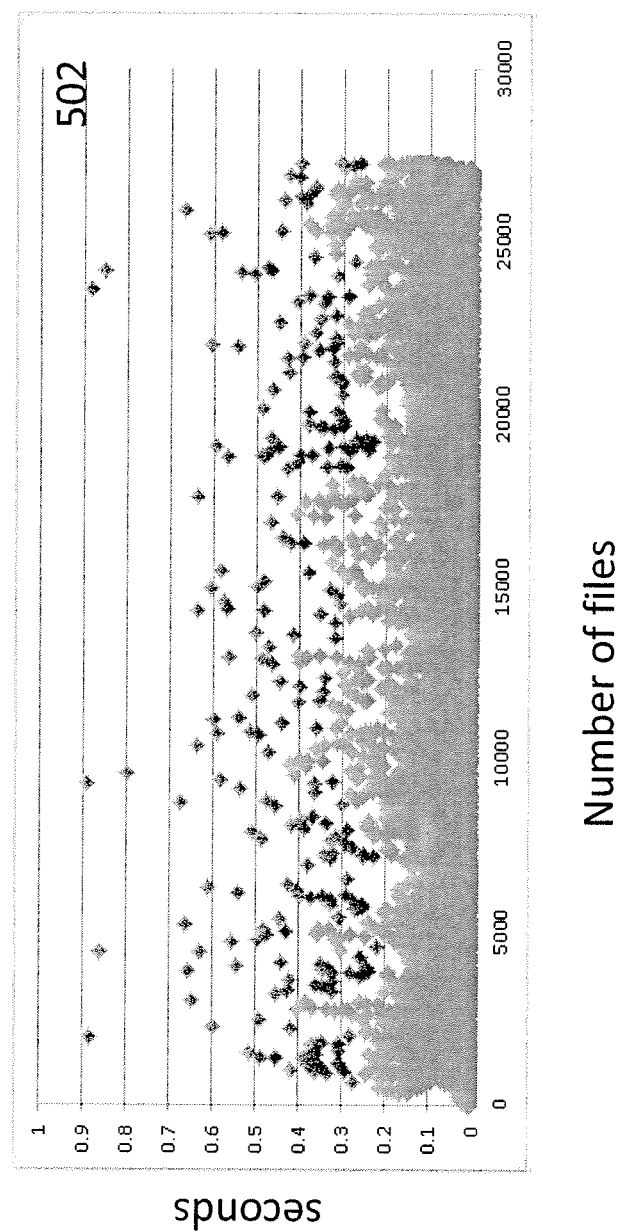
FIG. 5 is a graph that illustrates the time required to merge layout files obtained from computing nodes using the embodiments disclosed herein.

FIG. 5 is a graph 502 that illustrates the time required to merge layout files obtained from computing nodes using the embodiments disclosed herein. As illustrated, a large number of layout files (e.g., tens of thousands) from different computing nodes can be merged in a substantially small amount of time (e.g., few second). Thus, by reducing the amount of time required to obtain a corrected layout, the time required for manufacturing the mask and for performing the associated semiconductor manufacturing processes are reduced.

Figure 6:
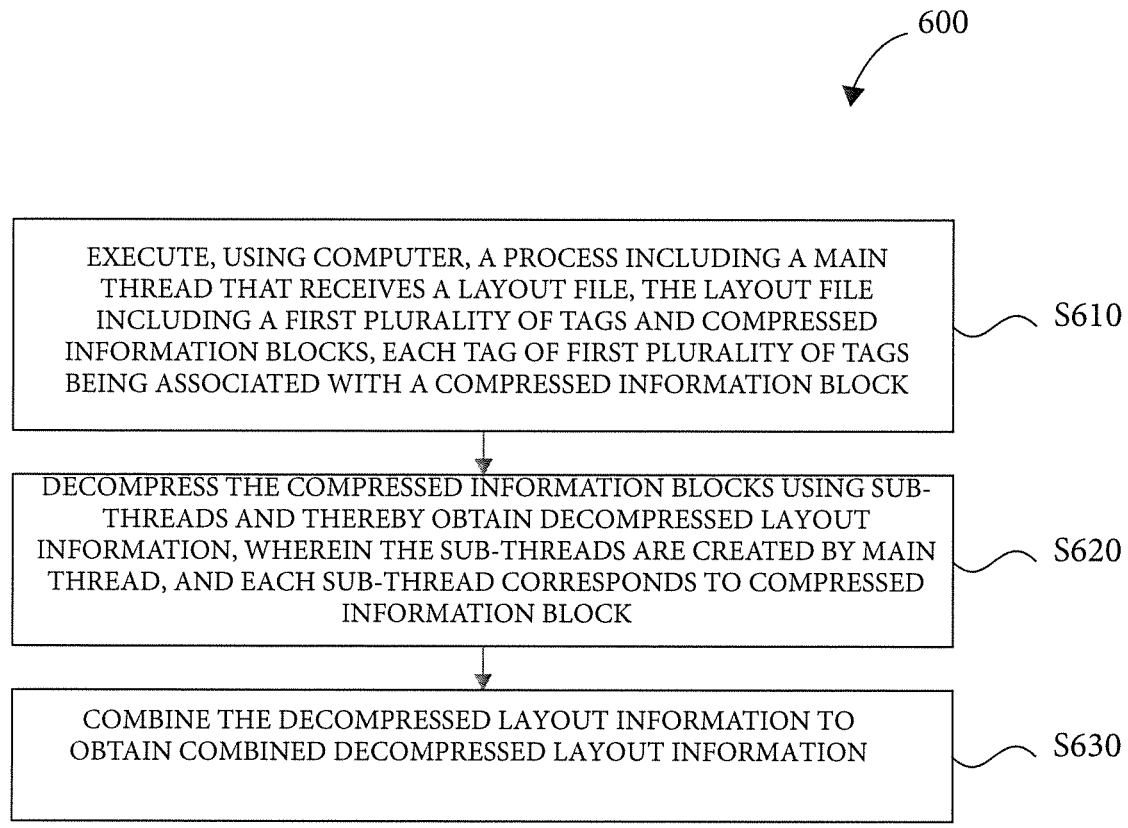
FIG. 6 is a flowchart illustrating a method of importing a layout file according to an embodiment of the present disclosure.

An embodiment of the present disclosure is a method 600 of importing a layout file according to the flowchart illustrated in FIG. 6. It is understood that additional operations can be provided before, during, and after operations discussed in FIG. 6, and some of the operations described below can be replaced or eliminated, for additional embodiments of the method. The order of the operations may be interchangeable and at least some of the operations may be performed in a different sequence. At least two or more operations may be performed overlapping in time, or almost simultaneously.

The method 600 includes an operation S610 of executing, using a computer, a process including a main thread that receives a layout file. The layout file includes a first plurality of tags and compressed information blocks, and each tag of the first plurality of tags is associated with a compressed information block. In operation S620, the compressed information blocks are decompressed using sub-threads and decompressed layout information is obtained from each sub-thread. The sub-threads are created by the main thread, and each sub-thread corresponds to a compressed information block. In operation S630, the decompressed layout information from each sub-thread is combined to obtain a combined decompressed layout information.

Figure 7:
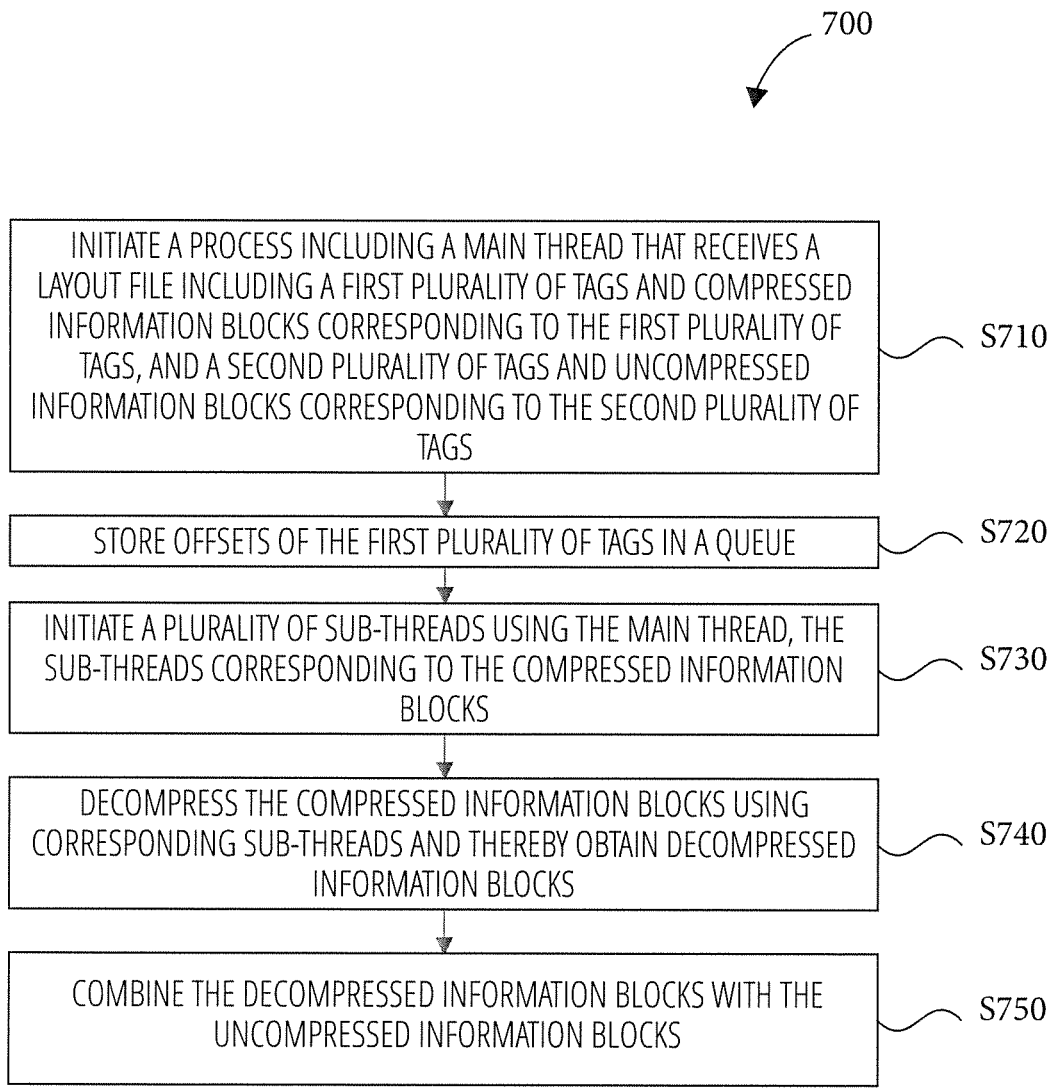
FIG. 7 is a flowchart illustrating a method of importing a layout file according to an embodiment of the present disclosure.

An embodiment of the present disclosure is a method 700 of importing a layout file according to the flowchart illustrated in FIG. 7. It is understood that additional operations can be provided before, during, and after operations discussed in FIG. 7, and some of the operations described below can be replaced or eliminated, for additional embodiments of the method. The order of the operations may be interchangeable and at least some of the operations may be performed in a different sequence. At least two or more operations may be performed overlapping in time, or almost simultaneously.

The method 700 includes an operation S710 of initiating a process including a main thread that receives a layout file. The layout file includes a first plurality of tags and compressed information blocks corresponding to the first plurality of tags, and a second plurality of tags and uncompressed information blocks corresponding to the second plurality of tags. In operation S720, offsets of the first plurality of tags are stored in a queue. In operation S730, a plurality of sub-threads are initiated using the main thread. The sub-threads correspond to the compressed information blocks. In operation S740, the compressed information blocks are decompressed using corresponding sub-threads and decompressed information blocks are thereby obtained. In operation S750, the decompressed information blocks are combined with the uncompressed information blocks to obtain decompressed layout information. The decompressed layout information is stored in a database (library).

Figure 8:
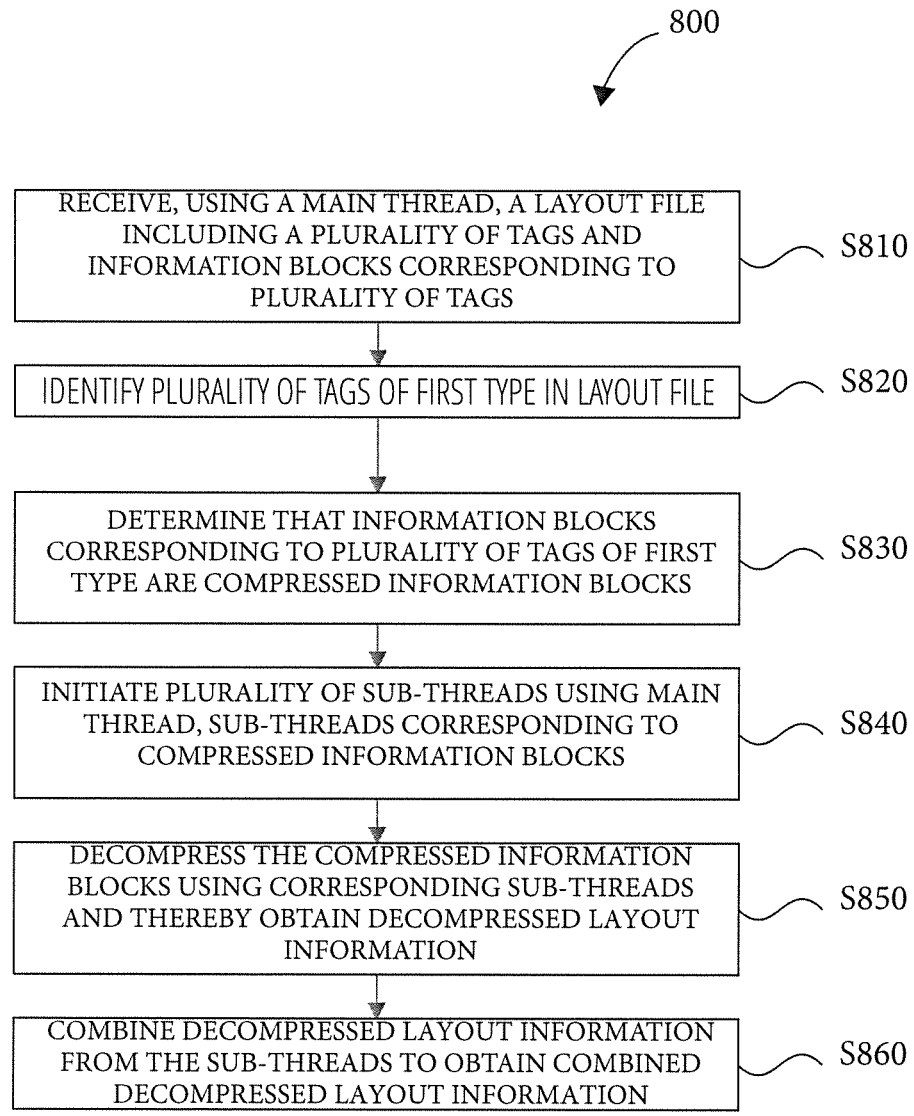
FIG. 8 is a flowchart illustrating a method of importing a layout file according to an embodiment of the present disclosure.

An embodiment of the present disclosure is a method 800 of importing a layout file according to the flowchart illustrated in FIG. 8. It is understood that additional operations can be provided before, during, and after operations discussed in FIG. 8, and some of the operations described below can be replaced or eliminated, for additional embodiments of the method. The order of the operations may be interchangeable and at least some of the operations may be performed in a different sequence. At least two or more operations may be performed overlapping in time, or almost simultaneously.

The method 800 includes an operation S810 of receiving, using a main thread, a layout file including a plurality of tags and information blocks corresponding to the plurality of tags. In operation S820, a plurality of tags of a first type are identified in the layout file. In operation S830, information blocks corresponding to the plurality of tags of the first type are determined as compressed information blocks. In operation S840, a plurality of sub-threads are initiated using the main thread, the sub-threads corresponding to the compressed information blocks. In operation S850, the compressed information blocks are decompressed using corresponding sub-threads and thereby decompressed layout information is obtained. In operation S860, the decompressed layout information from the sub-threads is combined to obtain a combined decompressed layout information.

Figure 9:
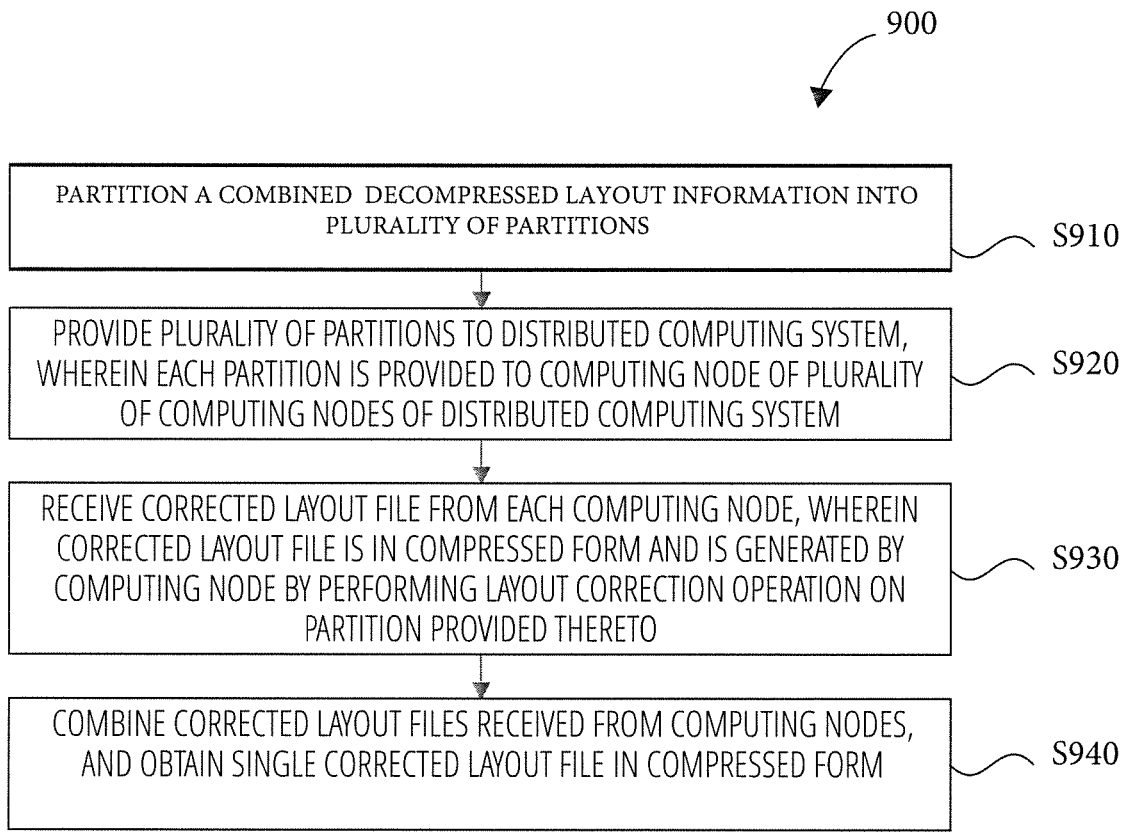
FIG. 9 is a flowchart illustrating a method of exporting a layout file according to an embodiment of the present disclosure.

An embodiment of the present disclosure is a method 900 of exporting a layout file according to the flowchart illustrated in FIG. 9. It is understood that additional operations can be provided before, during, and after operations discussed in FIG. 9, and some of the operations described below can be replaced or eliminated, for additional embodiments of the method. The order of the operations may be interchangeable and at least some of the operations may be performed in a different sequence. At least two or more operations may be performed overlapping in time, or almost simultaneously.

The method 900 includes an operation S910 of partitioning a combined decompressed layout information into a plurality of partitions. In operation S920, the plurality of partitions are provided to a distributed computing system. Each partition is provided to a computing node of a plurality of computing nodes of the distributed computing system. In operation S930, a corrected layout file is received from each computing node. The corrected layout file is in a compressed form and is generated by the computing node by performing a layout correction operation on the partition provided thereto. In operation S940, the corrected layout files received from the computing nodes are combined, and a single corrected layout file in a compressed form is obtained.

FIG. 10 illustrates a host computing system 1010 for implementing the method in accordance with some embodiments of the disclosure. In some embodiments, the host computing system 1010 is implemented using hardware or a combination of software and hardware, either in a dedicated server, integrated into another entity, or distributed across multiple entities. The host computing system 1010 is communicably connected to a distributed computing system 1051 and the mask house 130 using a wireless or wired network 1040 to permit data exchange therebetween.

The host computing system 1010 includes a display 1011, a processor 1012, a memory 1013, an input/output interface 1014, a network interface 1015, and a storage 1016 storing an operating system 1017, and programs or applications 1018 such as an application for controlling the operations of the distributed computing system 1051 and the mask house 130. The processor 1012 can be a general-purpose microprocessor, a microcontroller, a digital signal processor (DSP), an application specific integrated circuit (ASIC), a field-programmable gate array (FPGA), a programmable logic device (PLD), a controller, a state machine, gated logic, discrete hardware components, or any other suitable entity that can perform calculations or other manipulations of information. The memory 1013 and storage 1016 can be one or more of a random access memory (RAM), a flash memory, a read-only memory (ROM), a programmable read-only memory (PROM), an erasable PROM (EPROM), registers, a hard disk, a removable disk, a CD-ROM, a DVD, or any other suitable storage device, for storing information and instructions to be executed by processor 1012. The memory 1013 may include the process 202, the main thread 204, the compressed block extractor 206, the sub-threads 210, the data buffer 208, the library 216, and the content collector 214. In some embodiments, the contents of the memory are implemented as a computer executable program code that is executed by the processor 1012 for directing the processor to perform methods consistent with the present disclosure. The processor 1012, memory 1013, and storage 1016 can be supplemented by, or incorporated in, special purpose logic circuitry.

The network interface 1015 includes networking interface cards, such as ethernet cards and modems. In some embodiments, the input/output interface 1014 is configured to connect to a plurality of devices, such as an input device and/or an output device. Example input devices include a keyboard and a pointing device, e.g., a mouse or a trackball, by which a user can provide input to the host computing system 1010. Other kinds of input devices are used to provide for interaction with a user as well, such as a tactile input device, visual input device, audio input device, or brain-computer interface device. For example, feedback provided to the user can be any form of sensory feedback, e.g., visual feedback, auditory feedback, or tactile feedback; and input from the user can be received in any form, including acoustic, speech, tactile, or brain wave input. Example output devices include display devices, such as an LED (light emitting diode), CRT (cathode ray tube), or LCD (liquid crystal display) screen, for displaying information to the user.

The applications 1018 can include instructions which, when executed by the host computing system 1010 (or the processor 1012 thereof), causes the host computing system 1010 (or the processor 1012 thereof) to control the operations of the distributed computing system 1051 and the mask house 130, and perform other operations, methods, and/or processes that are explicitly or implicitly described in the present disclosure.

The data 1019 stored in the storage 1016 can include data including default parameters used in the control operations, data that is received from the distributed computing system 1051 and/or the mask house 130, for example, through the input/output interface 1014 or through the network interface 1015, data for displaying on the display 1011, data that is transmitted to or received from the distributed computing system 1051 and/or the mask house 130 via the network 1040, data generated during operation of the host computing system 1010, or data required for the operation of the host computing system 1010. In some embodiments, the process 202, main thread 204, sub-threads 210, the data buffer 208 and the library 216 are generated in the memory 1013 and/or the storage 1016. The data 1019 includes compressed information block 304 and the associated tag 302 stored in the data buffer 208, and the decompressed file stored in the library 216.

An embodiment of the disclosure is a computer-implemented method that includes executing, using a computer, a process including a main thread that receives a layout file. The layout file includes a first plurality of tags and compressed information blocks and each tag of the first plurality of tags is associated with a compressed information block. The compressed information blocks are decompressed using sub-threads and thereby decompressed layout information is obtained. The sub-threads are created by the main thread, and each sub-thread corresponds to a compressed information block. The decompressed layout information from each sub-thread is combined to obtain a combined decompressed layout information and the combined decompressed layout information is stored in a database. In an embodiment, prior to decompressing the compressed information blocks, the method comprises: identifying the first plurality of tags in the layout file; and determining that information blocks corresponding to the first plurality of tags are compressed information blocks. In an embodiment, the computer-implemented method further comprises storing offsets of the first plurality of tags associated with compressed blocks in a data buffer; and providing the compressed information blocks to corresponding sub-threads for decompressing. In an embodiment, the computer-implemented method further comprises performing a layout correction operation on the combined decompressed layout information to obtain a corrected layout file, and using the corrected layout file for manufacturing a mask. In an embodiment, the layout file includes a second plurality of tags, each associated with an uncompressed information block, and the method includes combining the uncompressed information blocks with the decompressed information blocks in the database. In an embodiment, the method further includes partitioning the combined decompressed layout information into a plurality of partitions, and providing the plurality of partitions to a distributed computing system. Each partition is provided to a computing node of a plurality of computing nodes of the distributed computing system. In an embodiment, the computer-implemented method further includes receiving a corrected layout file from each computing node. The corrected layout file is in a compressed form and is generated by the computing node by performing a layout correction operation on the partition provided thereto. The method still includes combining the corrected layout files received from the computing nodes, and thereby obtain a single corrected layout file. The single corrected layout file is in a compressed form.

An embodiment of the disclosure is a system that includes a memory, storing instructions, and at least one processor that executes the instructions to initiate a process including a main thread that receives a layout file, the layout file including a first plurality of tags and compressed information blocks corresponding to the first plurality of tags, and a second plurality of tags and uncompressed information blocks corresponding to the second plurality of tags. The processor stores offsets of the first plurality of tags in a queue, initiates a plurality of sub-threads using the main thread, the sub-threads corresponding to the compressed information blocks, decompresses the compressed information blocks using corresponding sub-threads and thereby obtains decompressed information blocks. The processor combines the decompressed information blocks with the uncompressed information blocks to obtain a decompressed layout information. In an embodiment, the at least one processor executes the instructions to identify the first plurality of tags in the layout file, and determine that information blocks corresponding to the first plurality of tags are compressed information blocks. In an embodiment, the at least one processor executes the instructions to provide the compressed information blocks to the corresponding sub-threads for decompressing. In an embodiment, the at least one processor executes the instructions to store the decompressed layout information in a database. In an embodiment, the at least one processor executes the instructions to partition the decompressed layout information into a plurality of partitions, and provide the plurality of partitions to a distributed computing system, wherein each partition is provided to a computing node of a plurality of computing nodes of the distributed computing system. In an embodiment, the at least one processor executes the instructions to receive a corrected layout file from each computing node, wherein the corrected layout file is in a compressed form and is generated by the computing node by performing a layout correction operation on the partition provided thereto, and to combine the corrected layout files received from the computing nodes, and thereby obtain a single corrected layout file corresponding to the layout file, the single corrected layout file being in a compressed form. In an embodiment, the at least one processor executes the instructions to receive the layout file from a design house, the layout file including geometrical patterns designed for an integrated circuit, and provide the single corrected layout file to a mask house for generating a mask for fabricating the integrated circuit.

An embodiment of the disclosure is a non-transitory, computer-readable medium including instructions stored in a memory which, when executed by a processor cause a computer to perform a method. The method includes receiving, using a main thread, a layout file including a plurality of tags and information blocks corresponding to the plurality of tags. A plurality of tags of a first type are identified in the layout file. It is determined that information blocks corresponding to the plurality of tags of the first type are compressed information blocks. A plurality of sub-threads are initiated using the main thread. The sub-threads correspond to the compressed information blocks. The compressed information blocks are decompressed using corresponding sub-threads and thereby decompressed layout information is obtained. The decompressed layout information from the sub-threads is combined to obtain a combined decompressed layout information. In an embodiment, the method further includes storing offsets of the plurality of tags associated with the compressed information blocks in a queue. In an embodiment, the method further includes identifying a plurality of tags of a second type. It is determined that information blocks corresponding to the plurality of tags of the second type are uncompressed information blocks. The uncompressed information blocks are combined with the decompressed information blocks to obtain the combined decompressed layout information. In embodiment, the method further includes partitioning the combined decompressed layout information into a plurality of partitions. The plurality of partitions are provided to a distributed computing system, wherein each partition is provided to a computing node of a plurality of computing nodes of the distributed computing system. In an embodiment, the method further includes receiving a corrected layout file from each computing node. The corrected layout file is in a compressed form and is generated by the computing node by performing a layout correction operation on the partition provided thereto. The corrected layout files received from the computing nodes is combined, and a single corrected layout file corresponding to the layout file is obtained. The single corrected layout file is in a compressed form. In an embodiment, the method further includes receiving the layout file from a design house. The layout file included geometrical patterns designed for an integrated circuit. The single corrected layout file is provided to a mask house for generating a mask for fabricating the integrated circuit.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A computer-implemented method, comprising:
    executing, using a computer, a process including a main thread that receives a layout file, the layout file including a first plurality of tags and compressed information blocks, each tag of the first plurality of tags being associated with a compressed information block;
    decompressing the compressed information blocks using sub-threads and thereby obtaining decompressed layout information, wherein the sub-threads are created by the main thread, and each sub-thread corresponds to a compressed information block; and
    combining the decompressed layout information from each sub-thread to obtain a combined decompressed layout information and storing the combined decompressed layout information in a database.

2. The computer-implemented method of claim 1, wherein, prior to decompressing the compressed information blocks, the method comprises:
    identifying the first plurality of tags in the layout file; and
    determining that information blocks corresponding to the first plurality of tags are compressed information blocks.

3. The computer-implemented method of claim 1, further comprising:
    storing offsets of the first plurality of tags associated with compressed blocks in a data buffer; and
    providing the compressed information blocks to corresponding sub-threads for decompressing.

4. The computer-implemented method of claim 1, further comprising:
    performing a layout correction operation on the combined decompressed layout information to obtain a corrected layout file; and
    using the corrected layout file for manufacturing a mask.

5. The computer-implemented method of claim 1, wherein the layout file includes a second plurality of tags, each associated with an uncompressed information block, and the method comprises combining the uncompressed information blocks with the decompressed layout information.

6. The computer-implemented method of claim 1, further comprising:
    partitioning the combined decompressed layout information into a plurality of partitions; and
    providing the plurality of partitions to a distributed computing system, wherein each partition is provided to a computing node of a plurality of computing nodes of the distributed computing system.

7. The computer-implemented method of claim 6, further comprising:
    receiving a corrected layout file from each computing node,
        wherein the corrected layout file is in a compressed form and is generated by the computing node by performing a layout correction operation on the partition provided thereto; and
    combining the corrected layout files received from the computing nodes, and thereby obtain a single corrected layout file, the single corrected layout file being in a compressed form.

8. A system, comprising:
    a memory, storing instructions; and
    at least one processor that executes the instructions to:
        initiate a process including a main thread that receives a layout file, the layout file including a first plurality of tags and compressed information blocks corresponding to the first plurality of tags, and a second plurality of tags and uncompressed information blocks corresponding to the second plurality of tags;
        store offsets of the first plurality of tags in a queue;
        initiate a plurality of sub-threads using the main thread, the sub-threads corresponding to the compressed information blocks;
        decompress the compressed information blocks using corresponding sub-threads and thereby obtain decompressed information blocks; and
        combine the decompressed information blocks with the uncompressed information blocks to obtain decompressed layout information.

9. The system of claim 8, wherein the at least one processor executes the instructions to:
identify the first plurality of tags in the layout file; and
determine that information blocks corresponding to the first plurality of tags are compressed information blocks.

10. The system of claim 8, wherein the at least one processor executes the instructions to provide the compressed information blocks to the corresponding sub-threads for decompressing.

11. The system of claim 8, wherein the at least one processor executes the instructions to store the decompressed layout information in a database.

12. The system of claim 8, wherein the at least one processor executes the instructions to:
partition the decompressed layout information into a plurality of partitions; and
provide the plurality of partitions to a distributed computing system, wherein each partition is provided to a computing node of a plurality of computing nodes of the distributed computing system.

13. The system of claim 12, wherein the at least one processor executes the instructions to:
receive a corrected layout file from each computing node, wherein the corrected layout file is in a compressed form and is generated by the computing node by performing a layout correction operation on the partition provided thereto; and
combine the corrected layout files received from the computing nodes, and thereby obtain a single corrected layout file corresponding to the layout file, the single corrected layout file being in a compressed form.

14. The system of claim 13, wherein the at least one processor executes the instructions to:
receive the layout file from a design house, the layout file including geometrical patterns designed for an integrated circuit; and
provide the single corrected layout file to a mask house for generating a mask for fabricating the integrated circuit.

15. A non-transitory, computer-readable medium comprising instructions stored in a memory which, when executed by a processor cause a computer to perform a method, the method comprising:
receiving, using a main thread, a layout file including a plurality of tags and information blocks corresponding to the plurality of tags;
identifying a plurality of tags of a first type in the layout file;
determining that information blocks corresponding to the plurality of tags of the first type are compressed information blocks;
initiating a plurality of sub-threads using the main thread, the sub-threads corresponding to the compressed information blocks;
decompressing the compressed information blocks using corresponding sub-threads and thereby obtain decompressed layout information; and
combining the decompressed layout information from the sub-threads to obtain a combined decompressed layout information.

16. The non-transitory, computer-readable medium of claim 15, wherein the method further comprises storing offsets of the plurality of tags associated with the compressed information blocks in a queue.

17. The non-transitory, computer-readable medium of claim 15, wherein the method further comprises:
identifying a plurality of tags of a second type;
determining that information blocks corresponding to the plurality of tags of the second type are uncompressed information blocks; and
combining the uncompressed information blocks with the decompressed layout information to obtain the combined decompressed layout information.

18. The non-transitory, computer-readable medium of claim 17, wherein the method further comprises:
partitioning the combined decompressed layout information into a plurality of partitions; and
providing the plurality of partitions to a distributed computing system, wherein each partition is provided to a computing node of a plurality of computing nodes of the distributed computing system.

19. The non-transitory, computer-readable medium of claim 18, wherein the method further comprises:
receiving a corrected layout file from each computing node,
wherein the corrected layout file is in a compressed form and is generated by the computing node by performing a layout correction operation on the partition provided thereto; and
combining the corrected layout files received from the computing nodes, and thereby obtaining a single corrected layout file corresponding to the layout file, the single corrected layout file being in a compressed form.

20. The non-transitory, computer-readable medium of claim 19, wherein the method further comprises:
receive the layout file from a design house, the layout file including geometrical patterns designed for an integrated circuit; and
provide the single corrected layout file to a mask house for generating a mask for fabricating the integrated circuit.

* * * * *